United States Patent
Risler

(12) 
(10) Patent No.: US 6,223,330 B1
(45) Date of Patent: Apr. 24, 2001

(54) SYSTEM AND METHOD FOR DESIGNING INTEGRATED CIRCUITS USING CELLS WITH MULTIPLE UNRELATED OUTPUTS

(75) Inventor: Daniel A. Risler, Austin, TX (US)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 09/382,361

(22) Filed: Aug. 24, 1999

(51) Int. Cl.[7] ................................................. G06F 17/50
(52) U.S. Cl. ................................................................ 716/8
(58) Field of Search .................................................. 716/8

(56) References Cited

U.S. PATENT DOCUMENTS 5,682,321 * 10/1997 Ding ............................................. 716/8
5,864,165 * 1/1999 Rostoker .................................. 257/401

OTHER PUBLICATIONS

*Principles of CMOS VLSI Design, A Systems Perspective*, 2nd Ed., ©1993, pp. 282, 288. (No Month).
*Principles of CMOS VLSI Design, A Systems Perspective*, 1st Ed., ©1985, pp. 175–203. (No Month).

* cited by examiner

*Primary Examiner*—Matthew Smith
*Assistant Examiner*—Thuan Do
(74) *Attorney, Agent, or Firm*—Conley, Rose & Tayon, PC; Lawrence J. Merkel

(57) ABSTRACT

An apparatus and method is provided for reducing the area of integrated circuits using cells with multiple unrelated gates. A netlist is generated which includes cells and interconnecting nets. Each cell represents a circuit and each net represents an interconnection between cells. Combinable cells of the netlist are paired to create a list. A combinable cell represents a circuit having at least one transistor formed on a substrate area. This transistor includes a diffusion layer directly coupled to a voltage source via a diffusion contact, wherein the diffusion contact is positioned adjacent an outer edge of the substrate area. A combinability score is calculated for each pair of combinable cells of the list. Each combinability score is calculated as a function of the number of nets representing direct or indirect interconnections between a pair of combinable cells. The pair of combinable cells corresponding to the highest combinability score is removed from the netlist. Thereafter, a combined cell is added. This combined cell, prior to addition to the netlist, represents at least first and second circuits. Inputs and outputs of the first circuit are electrically isolated from inputs and outputs of the second circuit.

46 Claims, 8 Drawing Sheets

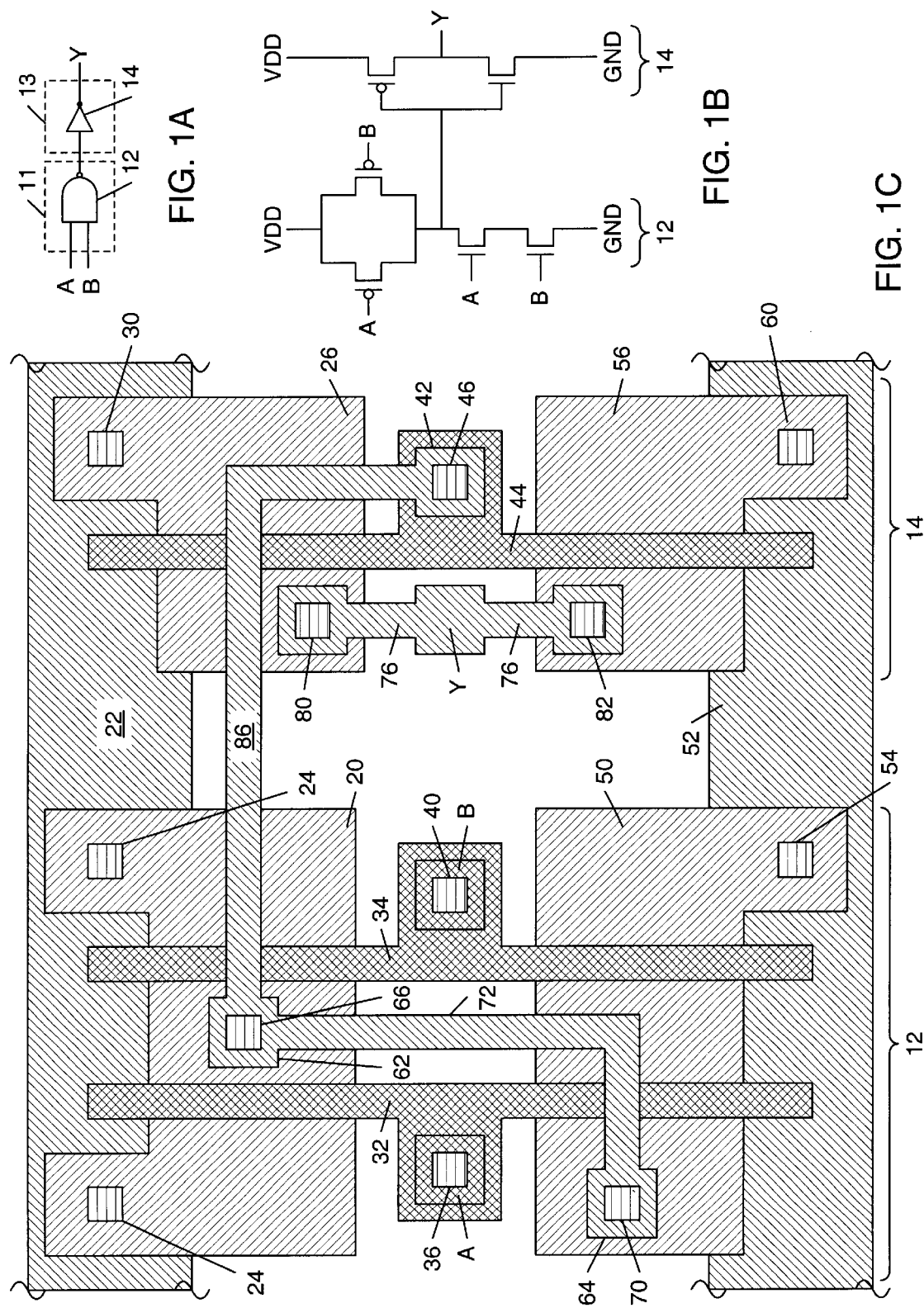

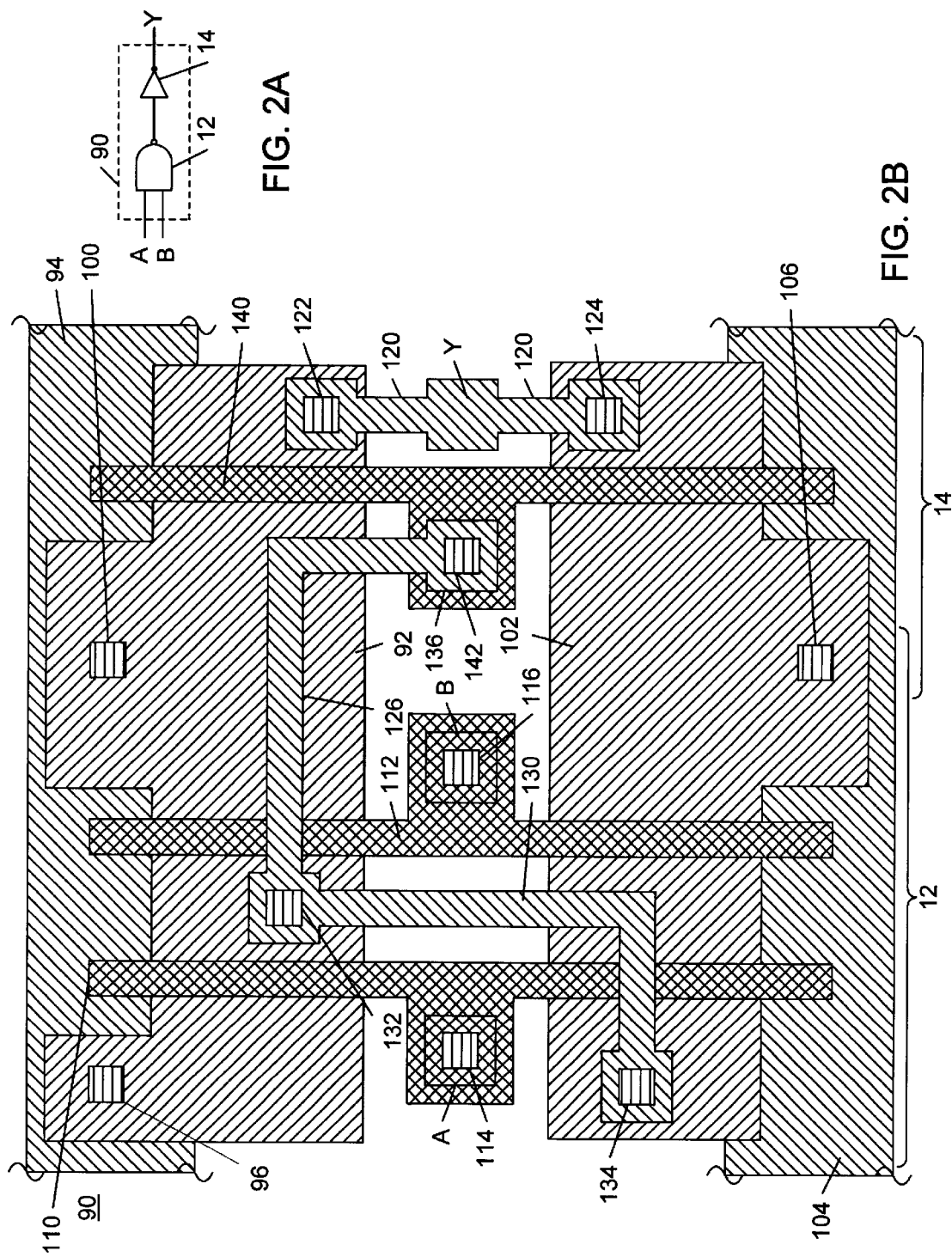

SYSTEM AND METHOD FOR DESIGNING INTEGRATED CIRCUITS USING CELLS WITH MULTIPLE UNRELATED OUTPUTS

BACKGROUND OF THE INVENTION

1. Field of the Invention

The present invention relates generally to the art of integrated circuits, and more particularly, to the design of integrated circuits.

2. Description of the Relevant Art

Today's integrated circuits are complex. Computer aided design and computer aided engineering tools are essential in designing these complicated integrated circuits. In the design process, computer aided design and computer aided engineering tools are often used to generate netlist and schematic representations of a complicated integrated circuit. A netlist is a text file describing the integrated circuit. A netlist representation can be translated into a schematic representation and vice versa. Schematics often consist of cells interconnected by nets that collectively and visually demonstrate the functional design of the integrated circuit. Cells represent circuits consisting of elemental elements such as transistors and resistors. Cells may also represent higher level abstractions of circuits including NAND gates, NOR gates, flip flops, etc. Nets represent interconnections that electrically couple cells to one another.

One of the primary goals behind designing complex integrated circuits is to reduce the physical area on a silicon substrate occupied by the integrated circuit. A reduction in integrated circuit area translates into higher production yield which in turn improves product profitability. In pursuit of this goal, it is common industry practice to combine related circuits or gates into a single standard cell. This concept is best explained with reference to an example.

FIG. 1A shows a cell 11 containing a NAND gate 12 and a cell 13 containing an inverter 14. Cells 11 and 13 are coupled together via a net. Cells 11 and 13 may be part of an integrated circuit schematic designed using computer aided design or computer aided engineering tools. The cells are related in that the output of cell 11 is coupled to the input of cell 14. FIG. 1B is a transistor level schematic diagram of gates 12 and 14 of the cells shown in FIG. 1A. FIG. 1C is a semiconductor layout schematic diagram of gates 12 and 14 of the cells shown in FIGS. 1A and 1B.

In FIG. 1C, NAND gate 12 includes a diffusion layer 20 coupled to a metal layer 22 via contacts 24. Inverter 14 also includes a diffusion layer 26 coupled to metal layer 22 via contact 30. Metal layer 22 is typically coupled to a positive voltage source $V_{DD}$.

NAND gate 12 includes input pins A and B for receiving input signals. These input pins are coupled to polygates 32 and 34, respectively, via contacts 36 and 40, respectively. Inverter gate 14 includes an input pin 42 coupled to polygate 44 via contact 46.

NAND gate 12 includes diffusion layer 50 coupled to metalization layer 52 via contact 54. Inverter gate 14 likewise includes a diffusion layer 56 coupled to metalization layer 52 via contact 60. Typically, metalization layer 52 is coupled to ground.

The output of NAND gate 12 is represented by pins 62 and 64 coupled to diffusion layers 20 and 50, respectively, by contacts 66 and 70, respectively. Pins 62 and 64 are electrically coupled via metal layer 72. The output of inverter 14 is represented by pin Y coupled to diffusion layers 26 and 56, respectively, via metal layer 76 and contacts 80 and 82. As seen in FIG. 1C, the output of NAND gate 12 is coupled to the input of inverter 14 via metalization line 86.

FIG. 2A shows a logic level schematic diagram of a cell 90 comprising the NAND and inverter gates 12 and 14 of FIG. 1A. FIG. 1B shows a semiconductor layout representation of the cell 90 shown in FIG. 2A. The cell 90 in FIG. 2B includes diffusion layer 92 coupled to metal layer 94 via a pair of contacts 96 and 100. Typically, metal layer 94 is coupled to a positive voltage source $V_{DD}$. Cell 90 in FIG. 2B also includes a second diffusion layer 102 coupled to a metal layer 104 via contact 106. Typically, the second metal layer 104 is coupled to ground. Input pins A and B are coupled to polygates 110 and 112, respectively, via contacts 114 and 116, respectively. Output pin Y is coupled to diffusion layers 92 and 102 via metal line 120 and contacts 122 and 124. Internally, metal line 126 couples the output of NAND gate 12 to the input of inverter 14. More particularly, the output of NAND gate 12 includes metal line 130 coupled to diffusion layers 92 and 102 by contact 132 and 134, respectively. The input to inverter gate 14 is defined by metal bond pin 136 coupled to polygate 140 via contact 142.

FIGS. 1C and 2B are similar in structure. The primary difference lies in the shared diffusion layers and diffusion contacts. More particularly, the inverter gate 14 in FIG. 1C includes separate diffusion layers 26 and 56 coupled to metal layers 22 and 52, respectively, via contacts 30 and 60, respectively. Diffusion layers 26 and 56 are separate from the diffusion layers of the NAND gate 12. In contrast, inverter 14 in FIG. 2B shares diffusion layers 92 and 102 in addition to diffusion contacts 100 and 106 with NAND gate 12. This sharing reduces the overall width of cell 90 when compared to the semiconductor layout representation shown in FIG. 1C. Because diffusion to diffusion spacing is typically large with respect to the size of transistors, by sharing diffusion contacts between two adjacent transistors, a significant space saving is realized as can be seen when comparing FIGs. 1C and 2B.

SUMMARY OF THE INVENTION

The present invention provides an apparatus and method for reducing the size of integrated circuits. The method in one embodiment generates a netlist comprising cells and interconnecting nets, wherein each cell represents a circuit and each net represents an interconnection. Combinable cells of the netlist are paired to create a list of combinable cells. In one embodiment, each combinable cell represents a circuit having at least one transistor formed on a substrate area, the transistor having a first diffusion layer directly coupled to a first voltage source via a first diffusion contact. The first diffusion contact, in turn, is positioned adjacent an outer edge of the substrate area. After the list of combinable cell pairs is generated, the combinability score is calculated for each pair of the list. Each combinability score is calculated as a function of the number of nets representing direct or interconnections between a corresponding pair of combinable cells. The netlist is then modified. More particularly, the pair of combinable cells corresponding to the highest combinability score is removed from the netlist, and a combined cell is added. The combined cell, prior to addition to the netlist, represents at least first and second circuits, wherein the inputs and outputs of the first circuit are electrically isolated from inputs and outputs of the second circuit.

BRIEF DESCRIPTION OF THE DRAWINGS

Other objects and advantages of the invention will become apparent upon reading the following detailed description and upon reference to the accompanying drawings in which:

FIG. 1A is gate level schematic diagram of example standard cells found in computer aided design or computer aided engineering libraries;

FIG. 1B is a transistor level schematic diagram of the cells shown in FIG. 1A;

FIG. 1C is a semiconductor layout representation of the cells shown in FIG. 1A;

FIG. 2A is a gate level schematic diagram of an example standard cell found in prior art computer aided design or computer aided engineering tools;

FIG. 2B is a semiconductor layout schematic diagram of the cell shown in FIG. 2A;

Figure 3A:
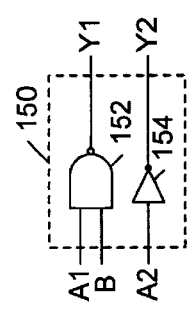
FIG. 3A is a gate level diagram of a cell employing the present invention.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As noted with respect to FIG. 2B, there must be a common electrical node before related gates of a cell are to share adjacent diffusion contacts. There are two possible electrical nodes that can be shared: a common signal node, such as an output, or a common supply node such as a power or a ground. Common nodes allow two unrelated transistors to share diffusion contacts. While the standard cell 90 shown in FIGS. 2A and 2B illustrate the area efficiency of combining related gates, the present invention provides a standard cell for use in computer aided engineering and computer aided design tools that includes unrelated gates and is also area efficient.

FIG. 3A shows a gate level schematic diagram of a library cell 150 including unrelated NAND gate 152 and inverter 154. Gates 152 and 154 are unrelated in that the inputs and outputs of NAND gate 152 are electrically isolated from the input and output of inverter 154 within the cell. Generally, a pair gates or circuits are unrelated if all of the signal inputs and outputs, including clock signals, of one of the gates or circuits are electrically isolated from all of the signal inputs and outputs of the other gate or circuit. If two gates or circuits of a cell share a signal, then the two gates or circuits are not considered unrelated. Two gates or circuits of a cell can share power or ground inputs and still be considered unrelated. In one embodiment electrically isolated means a lack of data communication between input or output nodes.

It is noted that cell 150 can be employed in a schematic representation of a complex integrated circuit. As noted above, a netlist defines a text file, wherein portions of the text file define cells and interconnecting nets. Computer aided engineering software can be used to translate a schematic into a corresponding netlist or a netlist into a corresponding schematic. Given this translation equivalency, the netlist will be understood to consist of cells with interconnecting nets such as that shown in FIG. 3A.

Figure 3B:
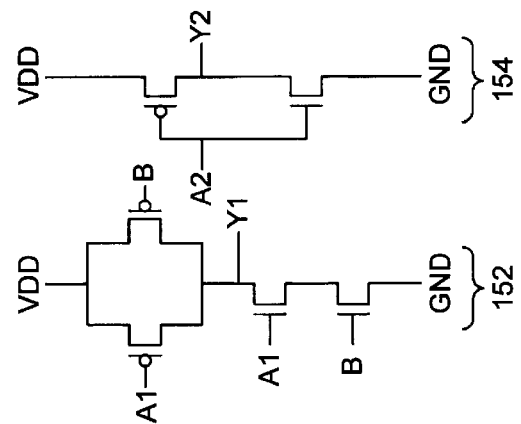
FIG. 3B is a transistor level schematic diagram of the cell shown in FIG. 3A.
Figure 3C:
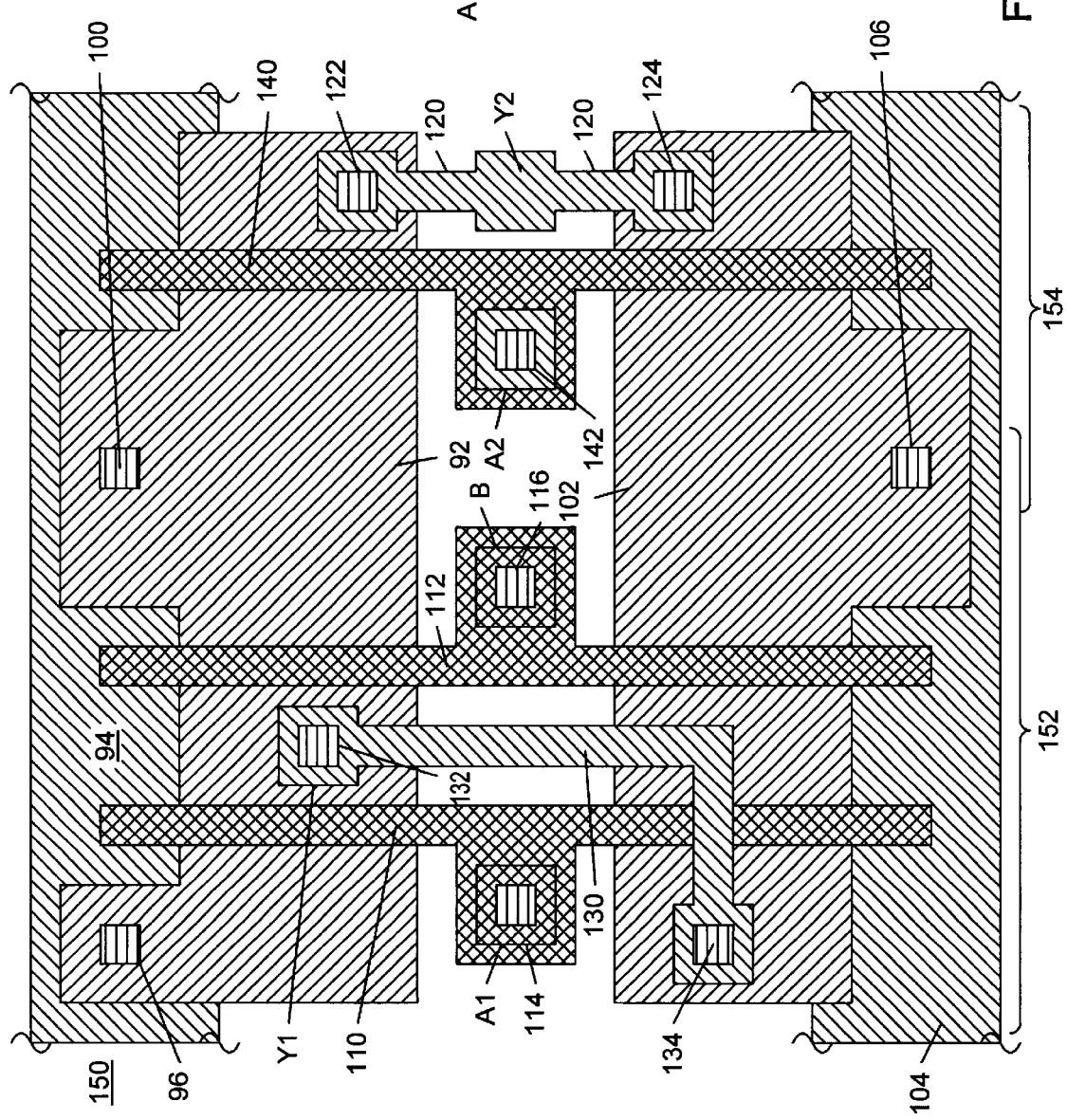
FIG. 3C is a semiconductor layout level schematic diagram of the cell shown FIG. 3A.

FIG. 3B shows a transistor level schematic diagram of the cell 150 of FIG. 3A. Again, it is noted that the inputs and outputs of NAND gate 152 are not connected to the input and output of inverter gate 154. FIG. 3C is a semiconductor layout representation of the cell 150 shown in FIGS. 3A and 3B. It is noted that the inputs and outputs of the NAND gates 152 and inverter 154 are commonly labeled in FIGS. 3A–3C. The semiconductor layout representation of cell 150 shown in FIG. 3C is similar to the semiconductor layout representation of cell 90 shown in FIG. 2B. The primary difference between these two figures is the lack of connecting metal layer 126 shown in FIG. 2B. Thus, inverter 154 and NAND gate 152 share diffusion layers 92 and 102 in addition to diffusion contacts 96, 100 and 106. By sharing diffusion layers and diffusion contacts, a cell containing unrelated gates may occupy less substrate surface area when compared to a pair of standard cells containing individual gates, respectively.

FIGS. 3A–3B show various representations of an example cell containing an inverter and an unrelated NAND gate sharing diffusion layers and diffusion contacts for use in the present invention. The present invention contemplates use of cells containing an inverter and other unrelated gates or circuits sharing diffusion layers and diffusion contacts such as shown in FIGS. 3A–3B. For example, the present invention contemplates cells containing an inverter and an unrelated NOR gate, XOR gate, XNOR gate, AOI21 gate (i.e., NOT ((A1 AND A2) OR B)) gate, AOI22 (i.e., NOT ((A1 AND A2) OR (B1 AND B2))) gate, OAI21 (i.e., NOT ((A1 OR A2) AND B)) gate, OAI22 (i.e., NOT((A1 OR A2) AND (B1 OR B2))) gate, flip-flop (e.g., D-flip-flop, JK-flip-flop, SR-flip-flop or T-flip-flop) gate, or latch (e.g., D-latch) gate. The present invention similarly contemplates use of cells containing a gate paired with an unrelated version of itself such as two NOR gates, two NAND gates, two flip-flop gates, etc. Lastly, the present invention contemplates use of cells containing a gate paired with an unrelated different gate such as NAND/NOR pair (including NAND/NOR pairs which have the same or different number of fan inputs, e.g., NAND2/NOR3), or NAND/flip-flop. Where flip-flops are used in a cell of unrelated gates, the present invention contemplates use of flip-flops with or without scan (scan enable (SE) and scan-in (SI) input pins), with or without reset (R), with or without set (S). Where D-flip-flops are used in a cell of unrelated gates, the present invention contemplates use of AND-flip-flops which are the same as D-flip-flops but with an internal AND function which gates two inputs (D1 AND D2). The present invention also contemplates use of cells containing unrelated D-latch variants such as set/reset D-latches, positive or negative enable D-latches, or D-latches with Q or QB (or both) outputs.

Figure 4:
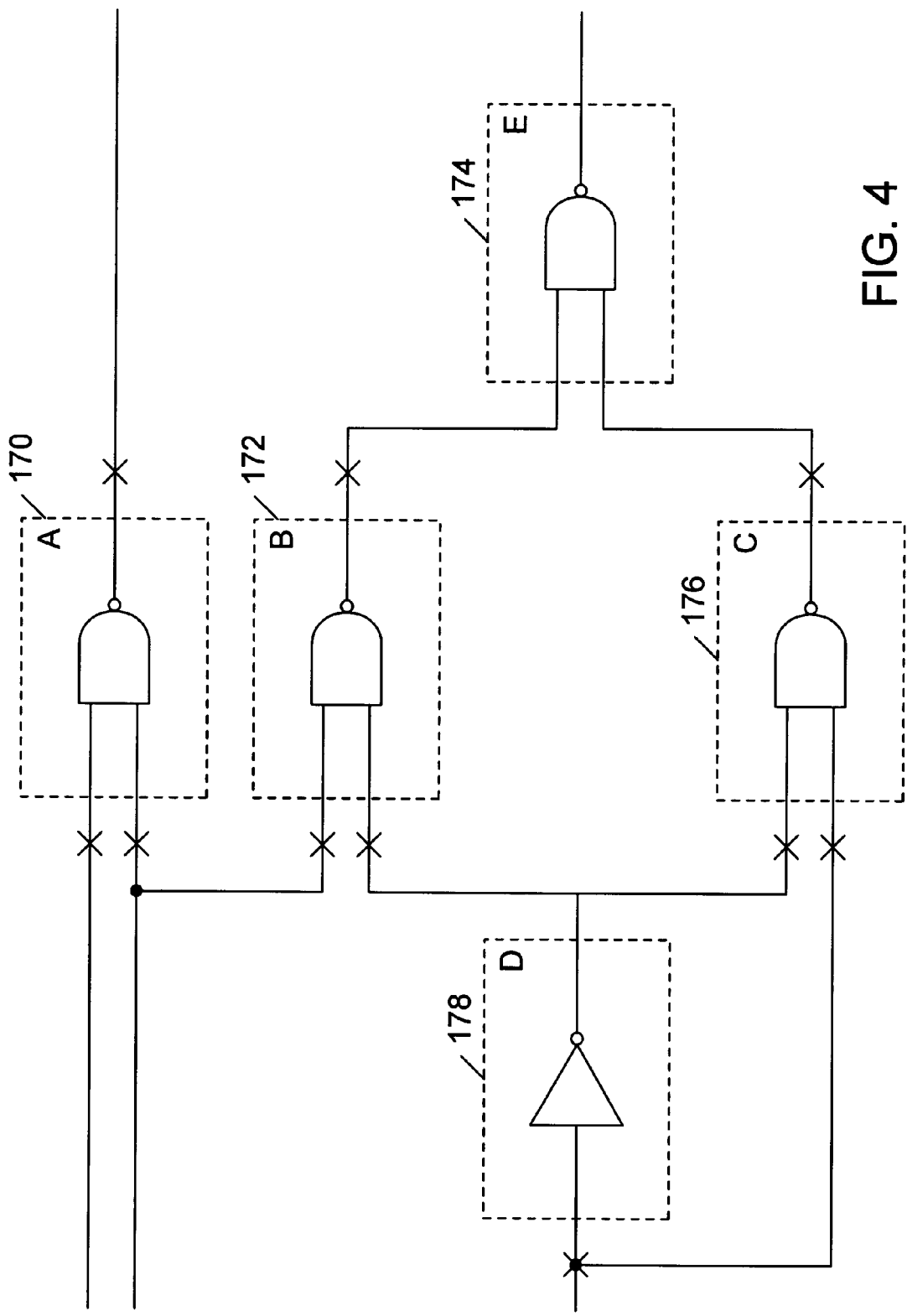
FIG. 4 is a portion of a schematic representation of an integrated circuit.
Figure 5:
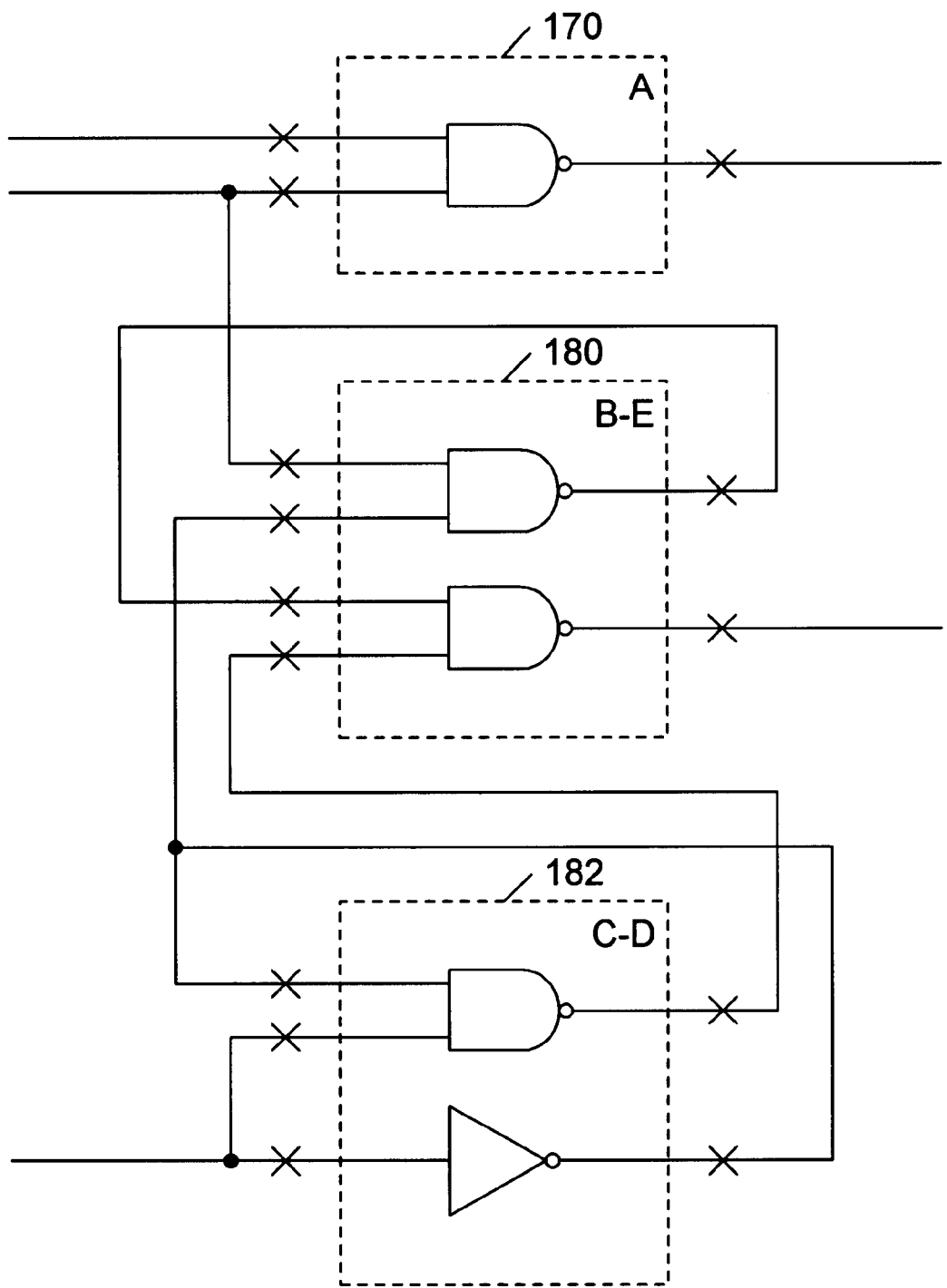
FIG. 5 is schematic portion of the integrated circuit shown in FIG. 4 after modification in accordance with the present invention.

FIG. 4 shows a portion of a netlist generated using conventional tools having a standard library of cells. FIG. 5 shows the netlist portion of the integrated circuit of FIG. 4 after modification in accordance with one embodiment of the present invention. The netlist portion shown in FIG. 4, generated by conventional tools shows five cells, 170–178, interconnected by various nets. Each of the cells 170–176 contain a NAND gate. Cell 178 contains an inverter. FIG. 5 shows the modified netlist having three separate cells, 170, 180, and 182 interconnected by various nets. Cell 170 of FIG. 4 is maintained in FIG. 5, while cells 172–178 have been replaced by cells 180 and 182 in accordance with one embodiment of the present invention. Cells 180 and 182 in FIG. 5 are examples of cells containing unrelated gates. That is, internally, the inputs and outputs of the gates in cells 180 and 182 are not connected to one another. In essence, FIG. 5 shows one example of how a netlist can be modified in accordance of the present invention to produce a modified netlist which represents an integrated circuit that occupies less area on silicon substrate when compared with the netlist of FIG. 4. The reduction in this area is due to use of cells of unrelated gates which share diffusion contacts. It is noted that the collective functions of the netlist portion shown in FIG. 4 and FIG. 5 are identical.

Figure 6:
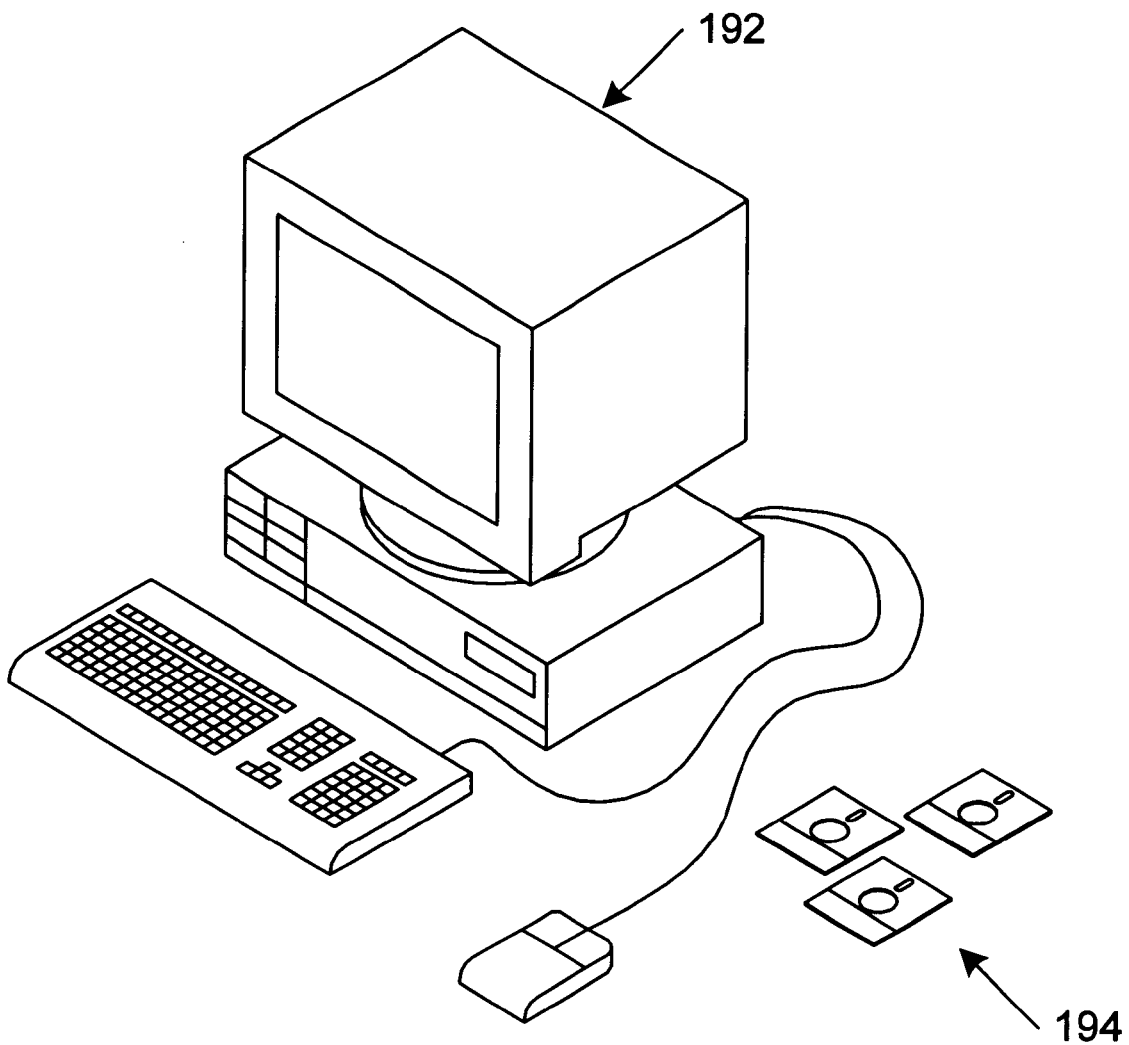
FIG. 6 is a system employing the present invention.

FIG. 6 shows a system used for modifying existing netlists, such as that shown in FIG. 4, or generating original netlists using cells containing unrelated gates in accordance with the present invention. More particularly, FIG. 6 shows a computer 192 which preferably includes a memory medium in which a computer program or computer programs for modifying netlists or creating original netlists according to one embodiment of the present invention are stored. It is noted that the present invention can be embodied in existing computer aided design or computer aided engineering tools with a modification of the existing computer program or computer programs stored or used therein. As used herein, the term memory medium includes a nonvolatile medium, e.g., a magnetic media or hard disk, or optical storage; a volatile medium, such as computer system memory, e.g., random access memory such as DRAM, SRAM, EDO RAM, RAMBUS RAM, DR DRAM, etc; or an installation medium, such as CD ROM or floppy disks 194, in which the computer programs according to the present invention are stored for loading into the computer system. The term memory medium may also include other types of memory. The memory medium may be comprised in computer 192 where the programs are executed, or may be located on a second computer which is coupled to the computer 192 through a network, such as a local area network (LAN), a wide area network (WAN), or the internet. In this instance, the second computer operates to provide the program instructions to computer 192 for execution. The software programs of the present invention are stored in the memory medium of the respective computer 192, or in a memory medium of another computer, and executed by the CPU. The CPU executing code and data from the memory medium thus comprises a need for modifying a netlist according to the steps described below. Further, it is noted that computer 192 may include additional memory for storing a library of cells including cells of unrelated gates in accordance with the present invention.

Figure 7:
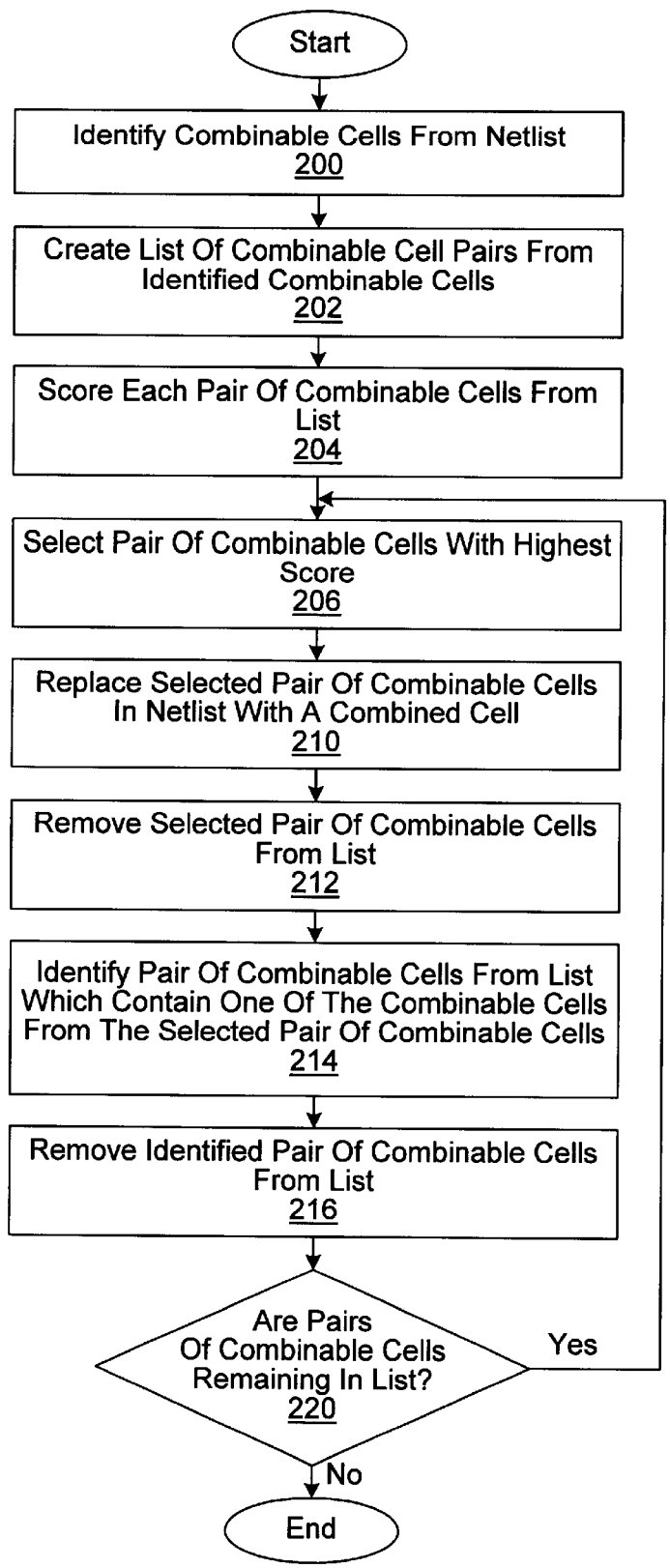
FIG. 7 is flow chart illustrating operational aspects of the present invention.

FIG. 7 is a flow chart illustrating operational aspects of one embodiment of the present invention for modifying an existing netlist to produce a modified netlist. The modification involves replacing two or more standard library cells of a netlist with a cell of unrelated gates thereby producing a modified netlist that represents an integrated circuit of reduced sized when formed in silicon. In the first step, step 200, the system 192, executing the program, identifies combinable cells from an existing netlist. A combinable cell in one embodiment represents a circuit having at least one transistor formed within a substrate area. This transistor has a first diffusion layer coupled to a first voltage source via a first diffusion contact in the substrate area. The first diffusion contact is positioned adjacent or on an edge of the substrate area. Adjacent in one embodiment means nearby such that no other component of the transistor, or circuit of which the transistor is a part, is between the diffusion contact and an edge of the substrate area except for a portion of the diffusion layer. With reference to FIG. 1C, both cells representing gates 12 and 14 are combinable.

Once all the combinable cells are identified within a netlist, a list of combinable cell pairs is generated in accordance with step 202 of FIG. 7. With reference to FIG. 4, each of the cells A–E is combinable. An example list formed in accordance with step 202 of FIG. 7 is shown in the table below.

TABLE 1

| | PAIRS OF COMBINABLE CELLS |
|---|---|
| 1. | (A-B) |
| 2. | (A-C) |
| 3. | (A-D) |
| 4. | (A-E) |
| 5. | (B-C) |
| 6. | (B-D) |
| 7. | (B-E) |
| 8. | (C-D) |
| 9. | (D-E) |

This list of combinable cell pairs represents potential pairs of combinable cells that can be replaced by a cell containing unrelated gates.

Figure 8:
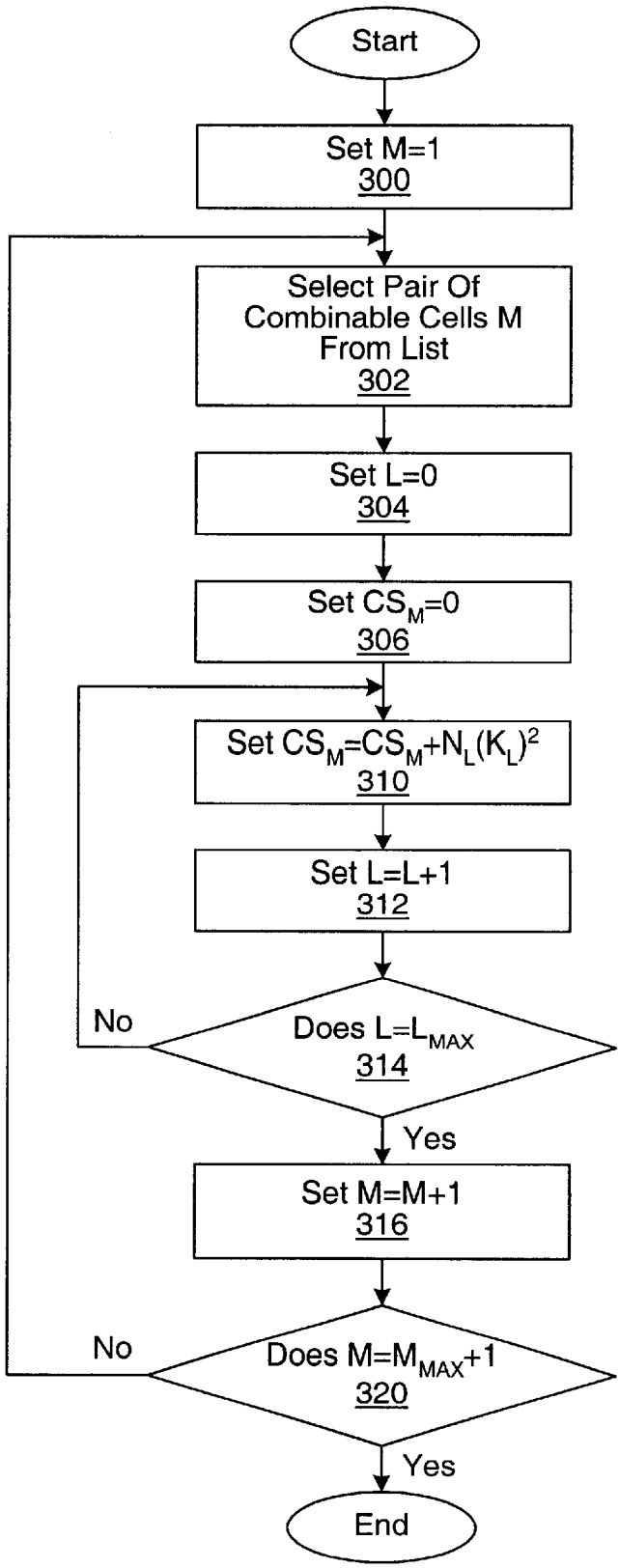
FIG. 8 is a flow chart illustrating operational aspects of calculating a compatibility score in accordance with the present invention.

In step 204, each pair of combinable cells is scored. FIG. 8 illustrates one embodiment of scoring combinable cell pairs. In FIG. 8 at step 300, a first counter M is set to 1. M identifies a pair of combinable cells from the list of combinable cell pairs. In step 302, the $M^{th}$ pair of combinable cells is selected from the list. In step 304, a second counter L is set to 0. L relates to a level of net interconnection between the $M^{th}$ pair of combinable cells. For example, level 0 or L=0 relates to nets directly coupling the $M^{th}$ combinable cells. Level 1 or L=1 relates to a pair of nets and an intervening cell that, in series, couple the $M^{th}$ combinable cells. Level 2 or L=2 relates to three nets and 2 intervening cells that, in series, couple the $M^{th}$ combinable cells.

In step 306, variable $CS_M$ is set to 0. This variable defines the combinability score for the $M^{th}$ pair of combinable cells from the list. In step 310, a combinability score is calculated as a function of a constant K and $N_L$, the number of nets at level L that couple the $M^{th}$ combinable cells. If combinable cells A and B of FIG. 4 are selected (i.e., M=1 with respect to the table above), then $N_0$=1 thereby indicating a single net which directly couples cells A and B. If combinable cell pair D and E is selected, then $N_1$=2 thereby indicating a pair of level 1 nets indirectly coupling cells D and E. K in the step 312 calculation is a constant which varies depending upon the level L. Shown below in Table 2 is one listing of K values for the first four levels of net interconnections.

TABLE 2

| L | K |
|---|---|
| 0 | 1 |
| 1 | .5 |
| 2 | .25 |
| 3 | .125 |

These K values can be tuned for the specific tool modifying the netlist or the type of netlist upon which the tool is operating. Tuning the K values can be accomplished by trial and error, i.e., picking random values and comparing the substrate area saved by the modified netlist using the set of random K values.

In step 312, the level L is incremented by 1 and in step 314 the current value of L is compared against a maximum value $L_{MAX}$. This maximum value of L can be any number. However, it is shown that the present invention performs reasonably well with $L_{MAX}=3$. If L does not equal $L_{MAX}$, then the process returns to step 310 and the pair ability score $PS_M$ is recalculated for the next level of net interconnect. However, if $L=L_{MAX}+1$, the process proceeds to step 316 where M is advanced by 1. In step 320, M is calculated to $M_{MAX}+1$. $M_{MAX}$ equals the total number of combinable cell pairs from the list. If $M=M_{MAX}+1$, then the process ends. On the other hand, if M does not equal $M_{MAX}+1$, then the next pair of combinable cells is selected from the list as the process returns to step 302.

Returning to FIG. 7, after a score is calculated for each pair of combinable cell pairs in step 204, then at step 206, the pair of combinable cells having the highest score is selected from the list. Table 3 below shows the results of calculating combinability score for each of the pair of combinable cells shown in Table 1.

TABLE 3

| PAIRS OF CELL CANDIDATES | | SCORE |
|---|---|---|
| 1. | (A-B) | 1.0 |
| 2. | (A-C) | 0.375 |
| 3. | (A-D) | 0.391 |
| 4. | (A-E) | 0.91 |
| 5. | (B-C) | 1.25 |
| 6. | (B-D) | 1.375 |
| 7. | (B-E) | 1.375 |
| 8. | (C-D) | 2.125 |
| 9. | (D-E) | 0.25 |

As noted in Table 3, combinable cell pair number 8 corresponds to the highest combinability score. In FIG. 4, combinable cell pair C and D correspond to this list entry. Cell D contains an inverter gate while cell C contains a NAND gate. FIG. 5 shows the results of replacing cells C and D with cell 182 which contains unrelated NAND and inverter gates.

Returning to FIG. 7, once the combinable cell pairs with the highest combinability score is replaced with a combined cell, the selected pair of combinable cells is removed from the list as shown in step 212. Thereafter in step 214, combinable pair cells which include cells replaced by the combined cell, are removed from the list of combinable cell pairs. At step 220, the combinable cell pair list is checked to determine whether combinable pairs remain. If at least one combinable pair cells remains on the list, the process returns to step 206. If the list is empty, the process ends.

As noted above, FIG. 5 shows the result of replacing combinable cells C and D of FIG. 4 with a combined cell of unrelated gates 182. Additionally, FIG. 5 shows the results of replacing combinable cells B and E with the combined cell of unrelated gates 180. Once the combinable cells are replaced, the nets are rearranged so that the netlist in FIG. 5 produces the same function of the netlist of FIG. 4.

In replacing combinable cells C and D and B and E of FIG. 4 with cells of unrelated gates 180 and 182 in FIG. 5, the substrate surface area occupied by the portion of the circuit represented in FIG. 5 will be less than the substrate area occupied by the circuit portion represented in FIG. 4. The reduced area results from cells of unrelated gates 180 and 182 sharing diffusion contacts as described, for example, with respect to FIG. 3C.

It is noted that FIGS. 7 and 8 illustrate modifying an existing netlist using cells of unrelated gates. The present invention should not be limited thereto. Rather, the present invention also contemplates generating original netlists using cells of unrelated gates or circuits.

Computer aided design or computer aided engineering tools select cells to build a schematic based on logic function, area, drive capability, performance, and power utilization. It is important to match these characteristics as closely as possible when replacing standard nonpaired cells with combined cells of unrelated gates. Along these lines, the sizes of the gate and the layouts are matched with the original as much as possible, and bilateral symmetry is used in the layout to achieve matching from the original combinable cell to the combined cell of unrelated gates. Matched device sizes and symmetrical layout between the original combinable cell and combined cells of unrelated gates is an important aspect. The following layout constraints should be followed in ordered to achieve this matching: diffusion (shared) contact placement should be centered on a common routing grid. It is common to use a common layout subcell to ensure that all aspects and symmetry of the layout are maintained as much as possible.

A second method of efficient substitution of combinable cells involves post placement. In this method, the original netlist containing combinable cells is placed using a place and route tool, and the distance between combinable cells is calculated. The combinable cells with the shortest distance between them are paired or replaced by a cell of unrelated gates. A new netlist is generated and placement is repeated to make any adjustments or improvements based on the new netlist construction.

An alternative method involves using the netlist analysis described method for only the highest scoring pair of combinable cells, then using post placement substitution to combine the remaining candidates based on distance score.

While the present invention has been described with reference to particular embodiments, it will be understood that the embodiments are illustrated and that the invention scope is not so limited. Any variations, modifications, additions and improvements to the embodiments described are possible. These variations, modifications, additions and improvements may fall within the scope of the invention as detailed within the following claims.

What is claimed is:

1. A method comprising:
    pairing combinable cells of a netlist to create a list of combinable cell pairs, wherein each combinable cell represents a circuit;
    calculating a combinability score for each pair of combinable cells of the list, wherein each combinability score is calculated responsive to the number of nets representing direct or indirect interconnections between a corresponding pair of combinable cells of the list;

removing the pair of combinable cells corresponding to the highest combinability score from the netlist, and;

adding a combined cell to the netlist, wherein the combined cell represents at least first and second circuits, wherein the first circuit corresponds to the circuit represented by a first of the pair of combinable cells, and wherein the second circuit corresponds to the circuit represented by the second of the pair of combinable cells, and wherein inputs and outputs of the first circuit are electrically isolated from inputs and outputs of the second circuit.

2. The method of claim 1 wherein each combinable cell represents a circuit having at least one transistor formed on a substrate area, wherein the at least one transistor comprises a first diffusion layer directly coupled to a first voltage source via a first diffusion contact, wherein the first diffusion contact is positioned adjacent an outer edge of the substrate area and a second transistor formed on the substrate area, wherein the second transistor comprises a second diffusion layer directly coupled to a second voltage source via a second diffusion contact, wherein the second diffusion contact is positioned adjacent the outer edge of the substrate area.

3. The method of claim 2 wherein the first voltage source comprises a positive voltage source, and wherein the second voltage source comprises ground.

4. The method of claim 1 wherein at least one combinability score is calculated responsive to the number of nets representing direct interconnections between at least one corresponding pair of combinable cells of the list multiplied by the square of a first constant.

5. The method of claim 4 wherein the first constant is about 0.3–0.7.

6. The method of claim 1 wherein at least one combinability score is calculated responsive to a number of first level nets representing indirect interconnections between at least one corresponding pair of combinable cells of the list, wherein a first level indirect net is defined as two nets coupled together via an intermediate cell of the netlist.

7. The method of claim 1 wherein at least one combinability score is calculated responsive to a number of first level nets representing indirect interconnections between at least one corresponding pair of combinable cells, a number of second level nets representing indirect interconnections between the at least one corresponding pair of combinable cells, and a number of third level nets representing indirect interconnections between the at least one corresponding pair of combinable cells, wherein a first level indirect net defines two nets coupled together via one intermediate cell of the netlist, wherein a second level indirect net defines three nets coupled together via two intermediate cells of the netlist, and wherein a third level indirect net defines four nets coupled together via three intermediate cells of the netlist.

8. The method of claim 7 wherein the at least one combinability score is calculated responsive to (1) the number of nets representing direct interconnections between the at least one corresponding pair of combinable cells multiplied by a square of a direct level constant, (2) the number of first level indirect nets multiplied by a square of a first level constant, (3) the number of second level indirect nets multiplied by a square of a second level constant, and (4) the number of third level indirect nets multiplied by a square of a third level constant, wherein the direct level constant is about 0.5–1.5, wherein the first level constant is about 0.25–0.75, wherein the second level constant is about 0.125–0.375, and wherein the third level constant is about 0.0625–0.1875.

9. A computer readable medium having computer-executable instructions readable by a computer to perform a method, the method comprising:

pairing combinable cells of a netlist to create a list of combinable cell pairs, wherein each combinable cell represents a circuit;

calculating a combinability score for each pair of combinable cells of the list, wherein each combinability score is calculated responsive to the number of nets representing direct or indirect interconnections between a corresponding pair of combinable cells of the list;

removing the pair of combinable cells corresponding to the highest combinability score from the netlist, and;

adding a combined cell to the netlist, wherein the combined cell represents at least first and second circuits, wherein the first circuit corresponds to the circuit represented by a first of the pair of combinable cells, and wherein the second circuit corresponds to the circuit represented by the second of the pair of combinable cells, and wherein inputs and outputs of the first circuit are electrically isolated from inputs and outputs of the second circuit.

10. The computer readable medium of claim 9 wherein each combinable cell represents a circuit having at least one transistor formed on a substrate area, wherein the at least one transistor comprises a first diffusion layer directly coupled to a first voltage source via a first diffusion contact, wherein the first diffusion contact is positioned adjacent an outer edge of the substrate area, and wherein the combined cell represents a shared diffusion layer directly coupled to the first voltage source via a shared diffusion contact, wherein the first circuit comprises a first poly gate extending over the shared diffusion layer, wherein the second circuit comprises a second poly gate extending over the shared diffusion layer, and wherein the first and second poly gates are positioned on opposite sides of the shared diffusion contact.

11. The computer readable medium of claim 9 wherein at least one combinability score is calculated responsive to the number of nets representing direct interconnections between at least one corresponding pair of combinable cells of the list multiplied by the square of a first constant.

12. The computer readable medium of claim 9 wherein at least one combinability score is calculated responsive to a number of first level nets representing indirect interconnections between at least one corresponding pair of combinable cells, a number of second level nets representing indirect interconnections between the at least one corresponding pair of combinable cells, and a number of third level nets representing indirect interconnections between the at least one corresponding pair of combinable cells, wherein a first level indirect net defines two nets coupled together via one intermediate cell of the netlist, wherein a second level indirect net defines three nets coupled together via two intermediate cells of the netlist, and wherein a third level indirect net defines four nets coupled together via three intermediate cells of the netlist.

13. A computer readable medium having computer-executable instructions readable by a computer to perform a method of modifying a netlist, wherein the netlist represents a plurality of cells and interconnecting nets, wherein each cell represents a circuit, wherein each net represents an interconnection between at least two of the cells, the method comprising:

pairing combinable cells of the netlist to create a list of combinable cell pairs, wherein each combinable cell represents a circuit;

calculating a combinability score for each pair of combinable cells of the list, wherein each combinability score is calculated responsive to the number of nets representing direct or indirect interconnections between a corresponding pair of combinable cells of the list;

removing the pair of combinable cells corresponding to the highest combinability score from the netlist, and;

adding a combined cell to the netlist, wherein the combined cell represents at least first and second circuits, wherein the first circuit corresponds to the circuit represented by a first of the pair of combinable cells, and wherein the second circuit corresponds to the circuit represented by the second of the pair of combinable cells, and wherein inputs and outputs of the first circuit are electrically isolated from inputs and outputs of the second circuit.

14. The computer readable medium of claim 13 wherein each combinable cell represents a circuit having at least one transistor formed on a substrate area, wherein the at least one transistor comprises a first diffusion layer directly coupled to a first voltage source via a first diffusion contact, wherein the first diffusion contact is positioned adjacent an outer edge of the substrate area, and wherein the combined cell represents a shared diffusion layer directly coupled to the first voltage source via a shared diffusion contact, wherein the first circuit comprises a first poly gate extending over the shared diffusion layer, wherein the second circuit comprises a second poly gate extending over the shared diffusion layer, and wherein the first and second poly gates are positioned on opposite sides of the shared diffusion contact.

15. The computer readable medium of claim 13 wherein at least one combinability score is calculated responsive to the number of nets representing direct interconnections between at least one corresponding pair of combinable cells of the list multiplied by the square of a first constant.

16. The computer readable medium of claim 13 wherein at least one combinability score is calculated responsive to a number of first level nets representing indirect interconnections between at least one corresponding pair of combinable cells, a number of second level nets representing indirect interconnections between the at least one corresponding pair of combinable cells, and a number of third level nets representing indirect interconnections between the at least one corresponding pair of combinable cells, wherein a first level indirect net defines two nets coupled together via one intermediate cell of the netlist, wherein a second level indirect net defines three nets coupled together via two intermediate cells of the netlist, and wherein a third level indirect net defines four nets coupled together via three intermediate cells of the netlist.

17. A system for generating a netlist representing an integrated circuit, the system comprising:

at least one processor for processing instructions;

a first computer readable medium in data communication with the processor, wherein the first computer readable medium is encoded with processor executable instructions for generating the netlist;

a second computer readable medium in data communication with the processor, wherein the second computer readable medium is encoded with a library of cells including at least one combined cell, wherein each cell of the library represents at least one circuit, wherein the at least one combined cell represents first and second circuits each having one or more input nodes and one or more output nodes, wherein all of the one or more input nodes of the first circuit are electrically isolated from all of the one or more output nodes of the second circuit, and wherein all of the one or more input nodes of the second circuit are electrically isolated from all of the one or more output nodes of the first circuit;

wherein the processor is configured to select a plurality of cells from the second computer readable medium in response to executing instructions for generating the netlist.

18. A method of identifying within a netlist a pair of combinable cells that can be replaced with a combined cell, wherein the netlist represents a plurality of cells and interconnecting nets, wherein each cell represents a circuit, wherein each net represents an interconnection between at least two cells, wherein a combinable cell represents a circuit having at least one transistor formed on a substrate area, wherein the at least one transistor comprises a first diffusion layer directly coupled to a first voltage source via a first diffusion contact, wherein the first diffusion contact is positioned adjacent an outer edge of the substrate area, wherein the combined cell represents at least first and second circuits, wherein inputs and outputs of the first circuit are electrically isolated from inputs and outputs of the second circuit, the method comprising:

pairing combinable cells of the netlist to create a list of combinable cell pairs;

calculating a combinability score for each pair of combinable cells of the list, wherein each combinability score is calculated responsive to the number of nets representing direct or indirect interconnections between a corresponding pair of combinable cells of the list;

comparing the combinability scores to identify the pair of combinable cells corresponding to the greatest combinability score for replacement in the netlist by a combined cell, wherein the first circuit of the combined cell is the circuit represented by a first of the pair of combinable cells, and wherein the second circuit of the combined cell is the circuit represented by a second of the pair of combinable cells, wherein inputs and outputs of the first circuit are electronically isolated from inputs and outputs of the second circuit.

19. A computer readable medium having computer-executable instructions readable by a computer to perform a method of identifying within a netlist a pair of combinable cells that can be replaced with a combined cell, wherein the netlist represents a plurality of cells and interconnecting nets, wherein each cell represents a circuit, wherein each net represents an interconnection between at least two cells, wherein a combinable cell represents a circuit having at least one transistor formed on a substrate area, wherein the at least one transistor comprises a first diffusion layer directly coupled to a first voltage source via a first diffusion contact, wherein the first diffusion contact is positioned adjacent an outer edge of the substrate area, wherein the combined cell represents at least first and second circuits, wherein inputs and outputs of the first circuit are electrically isolated from inputs and outputs of the second circuit, the method comprising:

pairing combinable cells of the netlist to create a list of combinable cell pairs;

calculating a combinability score for each pair of combinable cells of the list, wherein each combinability score is calculated responsive to the number of nets representing direct or indirect interconnections between a corresponding pair of combinable cells of the list;

comparing the combinability scores to identify the pair of combinable cells corresponding to the greatest combinability score for replacement in the netlist by a combined cell, wherein the first circuit of the combined cell is the circuit represented by a first of the pair of combinable cells, and wherein the second circuit of the combined cell is the circuit represented by a second of the pair of combinable cells, wherein inputs and outputs of the first circuit are electronically isolated from inputs and outputs of the second circuit.

20. A computer readable medium encoded with a library of cells including at least one combined cell, wherein each cell of the library represents at least one circuit, wherein the at least one combined cell represents first and second circuits each having one or more input nodes and one or more output nodes, wherein all of the one or more input nodes of the first circuit are electrically isolated from all of the one or more input nodes and all of the one or more output nodes of the second circuit, and wherein all of the one or more output nodes of the first circuit are electrically isolated from all of the one or more input nodes and all of the one or more output nodes of the second circuit.

21. The computer medium of claim 20 wherein the first circuit comprises a first transistor formed on a substrate area, wherein the second circuit comprises a second transistor formed on the substrate area, wherein the first transistor comprises a diffusion layer directly coupled to a voltage source via a diffusion contact, and wherein the second transistor comprises the diffusion layer directly coupled to the voltage source via the diffusion contact.

22. The computer medium of claim 20 wherein the first circuit comprises a first transistor formed on a substrate area, wherein the second circuit comprises a second transistor formed on the substrate area, wherein the first transistor share a diffusion layer, wherein the diffusion layer is directly coupled to a voltage source via a diffusion contact.

23. The computer medium of claim 20 wherein the first circuit comprises a first transistor formed on a substrate area, wherein the second circuit comprises a second transistor formed on the substrate area, wherein the first transistor comprises a first diffusion layer, and wherein the second transistor comprises a second diffusion layer, wherein the first and second diffusion layers are coupled to a voltage source via a diffusion contact.

24. The computer medium of claim 23 wherein the first circuit comprises a first polygate extending over the first diffusion layer, and wherein the second circuit comprises a second polygate extending over the second diffusion layer, wherein the diffusion contact is positioned between the first and second polygates.

25. The computer medium of claim 20 wherein the first circuit comprises an inverter.

26. The computer medium of claim 25 wherein the second circuit comprises a NAND gate.

27. The computer medium of claim 25 wherein the second circuit comprises a flip-flop gate.

28. The computer medium of claim 25 wherein the second circuit comprises an inverter.

29. The computer medium of claim 20 wherein the first circuit comprises a NAND gate.

30. The computer medium of claim 29 wherein the second circuit comprises a NAND gate.

31. The computer medium of claim 29 wherein the second circuit comprises a NOR gate.

32. The computer medium of claim 29 wherein the second circuit comprises a flip-flop gate.

33. The computer medium of claim 20 wherein the second circuit comprises a flip-flop.

34. The computer medium of claim 33 wherein the first circuit comprises a flip-flop.

35. A method comprising:
pairing combinable cells of a netlist to create a list of combinable cell pairs, wherein each combinable cell represents a circuit;
calculating a combinability score for each pair of combinable cells of the list, wherein each combinability score is indicative of a desirability of combining the pair of combinable cells; and
replacing the pair of combinable cells corresponding to the highest combinability score with a combined cell, wherein the combined cell represents at least first and second circuits, wherein the first circuit corresponds to the circuit represented by a first of the pair of combinable cells, and wherein the second circuit corresponds to the circuit represented by the second of the pair of combinable cells, and wherein inputs and outputs of the first circuit are electrically isolated from inputs and outputs of the second circuit, and wherein the first and second circuits share at least one diffusion layer.

36. The method of claim 35 wherein each combinable cell represents a circuit having at least one transistor formed on a substrate area, wherein the at least one transistor comprises a first diffusion layer directly coupled to a first voltage source via a first diffusion contact, wherein the first diffusion contact is positioned adjacent an outer edge of the substrate area and a second transistor formed on the substrate area, wherein the second transistor comprises a second diffusion layer directly coupled to a second voltage source via a second diffusion contact, wherein the second diffusion contact is positioned adjacent the outer edge of the substrate area.

37. The method of claim 36 wherein each of the first diffusion layer and the second diffusion layer are shared between the first circuit and the second circuit of the combined cell.

38. The method of claim 35 wherein at least one combinability score is calculated responsive to a number of first level nets representing indirect interconnections between at least one corresponding pair of combinable cells of the list, wherein a first level indirect net is defined as two nets coupled together via an intermediate cell of the netlist.

39. The method of claim 35 wherein at least one combinability score is calculated responsive to a number of first level nets representing indirect interconnections between at least one corresponding pair of combinable cells, a number of second level nets representing indirect interconnections between the at least one corresponding pair of combinable cells, and a number of third level nets representing indirect interconnections between the at least one corresponding pair of combinable cells, wherein a first level indirect net defines two nets coupled together via one intermediate cell of the netlist, wherein a second level indirect net defines three nets coupled together via two intermediate cells of the netlist, and wherein a third level indirect net defines four nets coupled together via three intermediate cells of the netlist.

40. The method of claim 39 wherein the at least one combinability score is calculated responsive to (1) the number of nets representing direct interconnections between the at least one corresponding pair of combinable cells multiplied by a square of a direct level constant, (2) the number of first level indirect nets multiplied by a square of a first level constant, (3) the number of second level indirect nets multiplied by a square of a second level constant, and (4) the number of third level indirect nets multiplied by a square of a third level constant.

41. A computer readable medium having computer-executable instructions readable by a computer to perform a method, the method comprising:

pairing combinable cells of a netlist to create a list of combinable cell pairs, wherein each combinable cell represents a circuit;

calculating a combinability score for each pair of combinable cells of the list, wherein each combinability score is indicative of a desirability of combining the pair of combinable cells;

replacing the pair of combinable cells corresponding to the highest combinability score with a combined cell, wherein the combined cell represents at least first and second circuits, wherein the first circuit corresponds to the circuit represented by a first of the pair of combinable cells, and wherein the second circuit corresponds to the circuit represented by the second of the pair of combinable cells, and wherein inputs and outputs of the first circuit are electrically isolated from inputs and outputs of the second circuit, and wherein the first and second circuits share at least one diffusion layer.

42. The computer readable medium of claim 41 wherein each combinable cell represents a circuit having at least one transistor formed on a substrate area, wherein the at least one transistor comprises a first diffusion layer directly coupled to a first voltage source via a first diffusion contact, wherein the first diffusion contact is positioned adjacent an outer edge of the substrate area and a second transistor formed on the substrate area, wherein the second transistor comprises a second diffusion layer directly coupled to a second voltage source via a second diffusion contact, wherein the second diffusion contact is positioned adjacent the outer edge of the substrate area.

43. The computer readable medium of claim 42 wherein each of the first diffusion layer and the second diffusion layer are shared between the first circuit and the second circuit of the combined cell.

44. The computer readable medium of claim 41 wherein at least one combinability score is calculated responsive to a number of first level nets representing indirect interconnections between at least one corresponding pair of combinable cells of the list, wherein a first level indirect net is defined as two nets coupled together via an intermediate cell of the netlist.

45. The computer readable medium of claim 41 wherein at least one combinability score is calculated responsive to a number of first level nets representing indirect interconnections between at least one corresponding pair of combinable cells, a number of second level nets representing indirect interconnections between the at least one corresponding pair of combinable cells, and a number of third level nets representing indirect interconnections between the at least one corresponding pair of combinable cells, wherein a first level indirect net defines two nets coupled together via one intermediate cell of the netlist, wherein a second level indirect net defines three nets coupled together via two intermediate cells of the netlist, and wherein a third level indirect net defines four nets coupled together via three intermediate cells of the netlist.

46. The computer readable medium of claim 45 wherein the at least one combinability score is calculated responsive to (1) the number of nets representing direct interconnections between the at least one corresponding pair of combinable cells multiplied by a square of a direct level constant, (2) the number of first level indirect nets multiplied by a square of a first level constant, (3) the number of second level indirect nets multiplied by a square of a second level constant, and (4) the number of third level indirect nets multiplied by a square of a third level constant.

* * * * *